US010381261B2

(12) United States Patent
Peidous et al.

(10) Patent No.: US 10,381,261 B2
(45) Date of Patent: Aug. 13, 2019

(54) METHOD OF MANUFACTURING HIGH RESISTIVITY SEMICONDUCTOR-ON-INSULATOR WAFERS WITH CHARGE TRAPPING LAYERS

(71) Applicant: SunEdison Semiconductor Limited (UEN201334164H), Singapore (SG)

(72) Inventors: Igor Peidous, Eaton, OH (US); Jeffrey L. Libbert, O'Fallon, MO (US); Srikanth Kommu, St. Charles, MO (US); Andrew Marquis Jones, Wildwood, MO (US); Samuel Christopher Pratt, St. Louis, MO (US); Horacio Josue Mendez, Austin, TX (US); Leslie George Stanton, Defiance, MO (US); Michelle Rene Dickinson, Ballwin, MO (US)

(73) Assignee: GlobalWafers Co., Ltd., Hsinchu (TW)

( * ) Notice: Subject to any disclaimer, the term of this patent is extended or adjusted under 35 U.S.C. 154(b) by 0 days.

(21) Appl. No.: 15/984,586

(22) Filed: May 21, 2018

(65) Prior Publication Data

US 2018/0277421 A1    Sep. 27, 2018

Related U.S. Application Data

(62) Division of application No. 15/526,798, filed as application No. PCT/US2015/060674 on Nov. 13, 2015.
(Continued)

(51) Int. Cl.
*H01L 21/762* (2006.01)
*H01L 21/02* (2006.01)

(52) U.S. Cl.
CPC .. *H01L 21/76251* (2013.01); *H01L 21/02164* (2013.01); *H01L 21/02255* (2013.01);
(Continued)

(58) Field of Classification Search
None
See application file for complete search history.

(56) References Cited

U.S. PATENT DOCUMENTS

| 4,501,060 A | 2/1985 | Frye et al. |
| 4,755,865 A | 7/1988 | Wilson et al. |

(Continued)

FOREIGN PATENT DOCUMENTS

| EP | 0939430 A2 | 1/1999 |
| EP | 1865551 A1 | 12/2007 |

(Continued)

OTHER PUBLICATIONS

Gamble, H.S. et al., Low-loss CPW Lines on Surface Stabilized High-Resistivity Silicon, IEEE Microwave and Guided Wave Letters, Oct. 1999, pp. 395-397, vol. 9, No. 10.
(Continued)

*Primary Examiner* — Bo B Jang
(74) *Attorney, Agent, or Firm* — Armstrong Teasdale LLP

(57) ABSTRACT

A method of preparing a single crystal semiconductor handle wafer in the manufacture of a semiconductor-on-insulator device is provided. The single crystal semiconductor handle wafer is prepared to comprise a charge trapping layer, which is oxidized. The buried oxide layer in the resulting semiconductor-on-insulator device comprises an oxidized portion of the charge trapping layer and an oxidized portion of the single crystal semiconductor device layer.

45 Claims, 2 Drawing Sheets

Related U.S. Application Data

(60) Provisional application No. 62/081,359, filed on Nov. 18, 2014.

(52) U.S. Cl.
CPC .. *H01L 21/02595* (2013.01); *H01L 21/76254* (2013.01); *H01L 21/0262* (2013.01); *H01L 21/02238* (2013.01); *H01L 21/02529* (2013.01); *H01L 21/02532* (2013.01)

(56) References Cited

U.S. PATENT DOCUMENTS

| | | | |
|---|---|---|---|
| 4,968,384 A | 11/1990 | Asano | |
| 5,189,500 A | 2/1993 | Kusunoki | |
| 5,374,564 A * | 12/1994 | Bruel | B28D 1/005 438/455 |
| 5,385,864 A * | 1/1995 | Kawasaki | H01L 21/02381 117/89 |
| 5,591,502 A * | 1/1997 | Kaneko | G11B 5/7315 204/192.2 |
| 6,043,138 A | 3/2000 | Ibok | |
| 6,373,113 B1 | 4/2002 | Gardner et al. | |
| 6,562,127 B1 | 5/2003 | Kud et al. | |
| 6,624,047 B1 | 9/2003 | Sakaguchi et al. | |
| 7,868,419 B1 | 1/2011 | Kerr et al. | |
| 7,879,699 B2 | 2/2011 | Schulze et al. | |
| 7,915,716 B2 | 3/2011 | Pisigan et al. | |
| 8,058,137 B1 | 11/2011 | Or-Bach et al. | |
| 8,076,750 B1 | 12/2011 | Kerr et al. | |
| 8,466,036 B2 | 6/2013 | Brindle et al. | |
| 8,481,405 B2 | 7/2013 | Arriagada et al. | |
| 8,796,116 B2 | 8/2014 | Grabbe et al. | |
| 8,846,493 B2 | 9/2014 | Libbert et al. | |
| 8,859,393 B2 | 10/2014 | Ries et al. | |
| 9,202,711 B2 | 12/2015 | Liu et al. | |
| 2002/0090758 A1 | 7/2002 | Henley et al. | |
| 2004/0005740 A1 | 1/2004 | Lochtefeld et al. | |
| 2004/0031979 A1 | 2/2004 | Lochtefeld et al. | |
| 2004/0108537 A1 | 6/2004 | Tiwari | |
| 2005/0153524 A1 | 7/2005 | Maa et al. | |
| 2005/0167002 A1 | 8/2005 | Ghyselen et al. | |
| 2006/0030124 A1 | 2/2006 | Maa et al. | |
| 2006/0033110 A1 | 2/2006 | Alam et al. | |
| 2006/0226482 A1 | 10/2006 | Suvorov | |
| 2007/0032040 A1 | 2/2007 | Lederer | |
| 2007/0054466 A1 | 3/2007 | Hebras | |
| 2008/0315349 A1 * | 12/2008 | Takei | H01L 21/187 257/506 |
| 2009/0004833 A1 | 1/2009 | Suzuki et al. | |
| 2009/0014828 A1 | 1/2009 | Mizushima et al. | |
| 2009/0092810 A1 | 4/2009 | Lee et al. | |
| 2009/0321829 A1 | 12/2009 | Nguyen et al. | |
| 2011/0174362 A1 | 7/2011 | Tanner et al. | |
| 2011/0298083 A1 | 12/2011 | Yoneda | |
| 2012/0091587 A1 | 4/2012 | Or-Bach et al. | |
| 2012/0161310 A1 | 6/2012 | Brindle et al. | |
| 2012/0238070 A1 | 9/2012 | Libbert et al. | |
| 2012/0267681 A1 | 10/2012 | Nemoto et al. | |
| 2013/0120951 A1 | 5/2013 | Zuo et al. | |
| 2013/0122672 A1 | 5/2013 | Or-Bach et al. | |
| 2013/0168835 A1 | 7/2013 | Botula et al. | |
| 2013/0193445 A1 | 8/2013 | Dennard et al. | |
| 2013/0294038 A1 | 11/2013 | Landru et al. | |
| 2013/0344680 A1 | 12/2013 | Arriagada et al. | |
| 2014/0042598 A1 | 2/2014 | Kitada et al. | |
| 2014/0070215 A1 | 3/2014 | Bedell et al. | |
| 2014/0084290 A1 | 3/2014 | Allibert et al. | |
| 2014/0120654 A1 | 5/2014 | Fujii et al. | |
| 2014/0124902 A1 | 5/2014 | Botula et al. | |
| 2014/0273405 A1 | 9/2014 | Liu et al. | |
| 2015/0004778 A1 | 1/2015 | Botula et al. | |
| 2015/0076586 A1 * | 3/2015 | Rabkin | G11C 16/0483 257/324 |
| 2015/0115480 A1 | 4/2015 | Peidous et al. | |

FOREIGN PATENT DOCUMENTS

| | | |
|---|---|---|
| EP | 2426701 A1 | 7/2012 |
| JP | 2012253364 A | 12/2012 |
| WO | 2009120407 A2 | 10/2009 |
| WO | 2012127006 A1 | 9/2012 |

OTHER PUBLICATIONS

Lederer, D. et al., Enhanced High resistivity SOI wafers for RF Applications, 2004, IEEE International SOI Conference, Oct. 2004, pp. 46-47.

Lederer D. et al., New Substrate Passivation Method Dedicated to HR SOI Wafer Fabrication Wth increased Substrate Resistivity, IEEE Electron Device Letters, Nov. 2005, pp. 805-807, vol. 26, No. 11.

Lederer, D. et al., Performance of SOI devices transferred onto passivated HR SOI substrates using a layer transfer technique, 2006, IEEE International SOI Conference Proceedings, 2006, pp. 29-30.

Kerr, Daniel C., Identification of RF harmonic distortion of Si substrates and its reduction using a trap-rich layer, IEEE (IEEE Topical Meeting), 2008, pp. 151-154.

Blicher, Adolph, Field-Effect and Bipolar Power Transistor Physics, Book, 1981, pp. 61-64, Academic Press, Inc.

Morkc, Hadis, Nanoheteroepitaxy and nano-ELO; Handbook of Nitride Semiconductors and Devices, Materials Properties, Physics, and Growth, 2009, Wiley, pp. 564-569, vol. 1, Chapter 3.5.5.3.

Zamir, S. et al., Reduction of cracks in GaN films on Si-on-insulator by lateral confined epitaxy, Journal of Crystal Growth, Elsevier Amsterdam, NL, Sep. 2002, pp. 375-380, vol. 243, No. 3-4.

Gao, Min, et al., A transmission electron microscopy study of microstructural defects in proton implanted silicon, Journal of Applied Physics, Oct. 15, 1996 American Institute of Physcis, pp. 4767-4769, vol. 70, No. 8.

Gao, Min, et al., Two-dimensional network of dislocations and nanocavities in hydrogen-implanted and two-step annealed silicon, Applied Physcis Letters, American Institute of Physics May 18, 1998, pp. 2544-2546, vol. 72, No. 20.

International Search Report and Written Opinion of the International Searching Authority regarding PCT/US2015/060674 dated Feb. 4, 2016; 14 pgs.

* cited by examiner

METHOD OF MANUFACTURING HIGH RESISTIVITY SEMICONDUCTOR-ON-INSULATOR WAFERS WITH CHARGE TRAPPING LAYERS

CROSS-REFERENCE TO RELATED APPLICATION

This application is a divisional application of U.S. application Ser. No. 15/526,798, filed May 15, 2017, the entire disclosure of which is hereby incorporated by reference in its entirety. U.S. application Ser. No. 15/526,798 is the U.S. national stage application of International Application No. PCT/US2015/060674, filed Nov. 13, 2015 and published as WO 2016/081313, the entire disclosure of which is hereby incorporated by reference in its entirety. International Application No. PCT/US2015/060674 claims priority to U.S. Provisional Patent Application No. 62/081,359 filed on 18 Nov. 2014, the entire disclosure of which is hereby incorporated by reference in its entirety.

THE FIELD OF THE INVENTION

The present invention generally relates to the field of semiconductor wafer manufacture. More specifically, the present invention relates to a method of preparing a handle substrate for use in the manufacture of a semiconductor-on-insulator (e.g., silicon-on-insulator) structure, and more particularly to a method for producing a charge trapping layer in the handle wafer of the semiconductor-on-insulator structure.

BACKGROUND OF THE INVENTION

Semiconductor wafers are generally prepared from a single crystal ingot (e.g., a silicon ingot) which is trimmed and ground to have one or more flats or notches for proper orientation of the wafer in subsequent procedures. The ingot is then sliced into individual wafers. While reference will be made herein to semiconductor wafers constructed from silicon, other materials may be used to prepare semiconductor wafers, such as germanium, silicon carbide, silicon germanium, or gallium arsenide.

Semiconductor wafers (e.g., silicon wafers) may be utilized in the preparation of composite layer structures. A composite layer structure (e.g., a semiconductor-on-insulator, and more specifically, a silicon-on-insulator (SOI) structure) generally comprises a handle wafer or layer, a device layer, and an insulating (i.e., dielectric) film (typically an oxide layer) between the handle layer and the device layer. Generally, the device layer is between 0.01 and 20 micrometers thick, such as between 0.05 and 20 micrometers thick. In general, composite layer structures, such as silicon-on-insulator (SOI), silicon-on-sapphire (SOS), and silicon-on-quartz, are produced by placing two wafers in intimate contact, followed by a thermal treatment to strengthen the bond.

After thermal anneal, the bonded structure undergoes further processing to remove a substantial portion of the donor wafer to achieve layer transfer. For example, wafer thinning techniques, e.g., etching or grinding, may be used, often referred to as back etch SOI (i.e., BESOI), wherein a silicon wafer is bound to the handle wafer and then slowly etched away until only a thin layer of silicon on the handle wafer remains. See, e.g., U.S. Pat. No. 5,189,500, the disclosure of which is incorporated herein by reference as if set forth in its entirety. This method is time-consuming and costly, wastes one of the substrates, and generally does not have suitable thickness uniformity for layers thinner than a few microns.

Another common method of achieving layer transfer utilizes a hydrogen implant followed by thermally induced layer splitting. Particles (e.g., hydrogen atoms or a combination of hydrogen and helium atoms) are implanted at a specified depth beneath the front surface of the donor wafer. The implanted particles form a cleave plane in the donor wafer at the specified depth at which they were implanted. The surface of the donor wafer is cleaned to remove organic compounds deposited on the wafer during the implantation process.

The front surface of the donor wafer is then bonded to a handle wafer to form a bonded wafer through a hydrophilic bonding process. Prior to bonding, the donor wafer and/or handle wafer are activated by exposing the surfaces of the wafers to plasma containing, for example, oxygen or nitrogen. Exposure to the plasma modifies the structure of the surfaces in a process often referred to as surface activation, which activation process renders the surfaces of one or both of the donor water and handle wafer hydrophilic. The wafers are then pressed together, and a bond is formed there between. This bond is relatively weak, and must be strengthened before further processing can occur.

In some processes, the hydrophilic bond between the donor wafer and handle wafer (i.e., a bonded wafer) is strengthened by heating or annealing the bonded wafer pair. In some processes, wafer bonding may occur at low temperatures, such as between approximately 300° C. and 500° C. In some processes, wafer bonding may occur at high temperatures, such as between approximately 800° C. and 1100° C. The elevated temperatures cause the formation of covalent bonds between the adjoining surfaces of the donor wafer and the handle wafer, thus solidifying the bond between the donor wafer and the handle wafer. Concurrently with the heating or annealing of the bonded wafer, the particles earlier implanted in the donor wafer weaken the cleave plane.

A portion of the donor wafer is then separated (i.e., cleaved) along the cleave plane from the bonded wafer to form the SOI wafer. Cleaving may be carried out by placing the bonded wafer in a fixture in which mechanical force is applied perpendicular to the opposing sides of the bonded wafer in order to pull a portion of the donor wafer apart from the bonded wafer. According to some methods, suction cups are utilized to apply the mechanical force. The separation of the portion of the donor wafer is initiated by applying a mechanical wedge at the edge of the bonded wafer at the cleave plane in order to initiate propagation of a crack along the cleave plane. The mechanical force applied by the suction cups then pulls the portion of the donor wafer from the bonded wafer, thus forming an SOI wafer.

According to other methods, the bonded pair may instead be subjected to an elevated temperature over a period of time to separate the portion of the donor wafer from the bonded wafer. Exposure to the elevated temperature causes initiation and propagation of a crack along the cleave plane, thus separating a portion of the donor wafer. This method allows for better uniformity of the transferred layer and allows recycle of the donor wafer, but typically requires heating the implanted and bonded pair to temperatures approaching 500° C.

The use of high resistivity semiconductor-on-insulator (e.g., silicon-on-insulator) wafers for RF related devices such as antenna switches offers benefits over traditional substrates in terms of cost and integration. To reduce parasitic power loss and minimize harmonic distortion inherent when using conductive substrates for high frequency applications it is necessary, but not sufficient, to use substrate wafers with a high resistivity. Accordingly, the resistivity of the handle wafer for an RF device is generally greater than about 500 Ohm-cm. With reference now to FIG. 1, a silicon on insulator structure 2 comprises a very high resistivity silicon wafer 4, a buried oxide (BOX) layer 6, and a silicon device layer 10. Such a substrate is prone to formation of high conductivity charge inversion or accumulation layers 12 at the BOX/handle interface causing generation of free carriers (electrons or holes), which reduce the effective resistivity of the substrate and give rise to parasitic power losses and device nonlinearity when the devices are operated at RF frequencies. These inversion/accumulation layers can be due to BOX fixed charge, oxide trapped charge, interface trapped charge, and even DC bias applied to the devices themselves.

A method is required therefore to trap the charge in any induced inversion or accumulation layers so that the high resistivity of the substrate is maintained even in the very near surface region. It is known that charge trapping layers (CTL) between the high resistivity handle substrates and the buried oxide (BOX) may improve the performance of RF devices fabricated using SOI wafers. A number of methods have been suggested to form these high interface trap layers. For example, with reference now to FIG. 2, one of the method of creating a semiconductor-on-insulator 20 (e.g., a silicon-on-insulator, or SOI) with a CTL for RF device applications is based on depositing an undoped polycrystalline silicon film 28 on a silicon substrate having high resistivity 22 and then forming a stack of oxide 24 and top silicon layer 26 on it. A polycrystalline silicon layer 28 acts as a high defectivity layer between the silicon substrate 22 and the buried oxide layer 24. See FIG. 2, which depicts a polycrystalline silicon film for use as a charge trapping layer 28 between a high resistivity substrate 22 and the buried oxide layer 24 in a silicon-on-insulator structure 20. An alternative method is the implantation of heavy ions to create a near surface damage layer. Devices, such as radiofrequency devices, are built in the top silicon layer 26.

It has been shown in academic studies that the polycrystalline silicon layer in between of the oxide and substrate improves the device isolation, decreases transmission line losses and reduces harmonic distortions. See, for example: H. S. Gamble, et al. "Low-loss CPW lines on surface stabilized high resistivity silicon," *Microwave Guided Wave Lett.*, 9(10), pp. 395-397, 1999; D. Lederer, R. Lobet and J.-P. Raskin, "Enhanced high resistivity SOI wafers for RF applications," *IEEE Intl. SOI Conf.*, pp. 46-47, 2004; D. Lederer and J.-P. Raskin, "New substrate passivation method dedicated to high resistivity SOI wafer fabrication with increased substrate resistivity," *IEEE Electron Device Letters*, vol. 26, no. 11, pp. 805-807, 2005; D. Lederer, B. Aspar, C. Laghaé and J.-P. Raskin, "Performance of RF passive structures and SOI MOSFETs transferred on a passivated HR SOI substrate," *IEEE International SOI Conference*, pp. 29-30, 2006; and Daniel C. Kerr et al. "Identification of RF harmonic distortion on Si substrates and its reduction using a trap-rich layer", Silicon Monolithic Integrated Circuits in RF Systems, 2008. SiRF 2008 (IEEE Topical Meeting), pp. 151-154, 2008.

The properties of polycrystalline silicon charge trapping layer depend upon the thermal treatments the semiconductor-on-insulator (e.g., silicon-on-insulator) receives. A problem that arises with these methods is that the defect density in the layer and interface tend to anneal out and become less effective at charge trapping as the wafers are subjected to the thermal processes required to make the wafers and build devices on them. Accordingly, the effectiveness of polycrystalline silicon CTL depends on the thermal treatments that SOI receives. In practice, the thermal budget of SOI fabrication and device processing is so high that the charge traps in conventional polycrystalline silicon are essentially eliminated. The charge trapping efficiency of these films becomes very poor.

SUMMARY OF THE INVENTION

In one aspect, the objective of this invention is to provide a method of manufacturing semiconductor-on-insulator (e.g., silicon-on-insulator) wafers with thermally stable charge trapping layers, which preserve the charge trapping effectiveness and significantly improve the performance of completed RF devices.

Briefly, the present invention is directed to a multilayer structure comprising: a single crystal semiconductor handle substrate comprising two major, generally parallel surfaces, one of which is a front surface of the single crystal semiconductor handle substrate and the other of which is a back surface of the single crystal semiconductor handle substrate, a circumferential edge joining the front and back surfaces of the single crystal semiconductor handle substrate, a bulk region between the front and back surfaces, and a central plane of the single crystal semiconductor handle substrate between the front and back surfaces of the single crystal semiconductor handle substrate, wherein the single crystal semiconductor handle substrate has a minimum bulk region resistivity of 100 Ohm-cm; a charge trapping layer in interfacial contact with the front surface layer of the single crystal silicon handle substrate, the charge trapping layer comprising one or more semiconductor layers, wherein each of the one or more semiconductor layers comprise a polycrystalline structure or an amorphous structure and further wherein each of the one or more semiconductor layers comprises a material selected from the group consisting of silicon, SiGe, SiC, and Ge; a semiconductor oxide layer in interfacial contact with the charge trapping layer, the semiconductor oxide layer comprising a first bonding surface; a dielectric layer, the dielectric layer comprising a second bonding surface, the second bonding surface of the dielectric layer in interfacial contact with the first bonding surface of the first semiconductor oxide layer; and a single crystal semiconductor device layer in interfacial contact with the dielectric layer.

The present invention is further directed to a method of preparing a semiconductor-on-insulator device. The method comprises: forming a charge trapping layer on a front surface layer of a single crystal semiconductor handle substrate, wherein the single crystal semiconductor handle substrate comprises two major, generally parallel surfaces, one of which is the front surface of the single crystal semiconductor handle substrate and the other of which is a back surface of the single crystal semiconductor handle substrate, a circumferential edge joining the front and back surfaces of the single crystal semiconductor handle substrate, a bulk region between the front and back surfaces, and a central plane of the single crystal semiconductor handle substrate between the front and back surfaces of the single crystal semiconductor handle substrate, wherein the single crystal semiconductor handle substrate has a minimum bulk region resistivity of 100 Ohm-cm and further wherein the charge trapping layer comprises one or more semiconductor layers, wherein each of the one or more semiconductor layers comprise a polycrystalline structure or an amorphous structure and further wherein each of the one or more semiconductor layers comprises a material selected from the group consisting of silicon, SiGe, SiC, and Ge; forming a semiconductor oxide layer on the charge trapping layer, wherein the semiconductor oxide layer has a thickness of at least about 0.1 micrometers; and bonding the semiconductor oxide layer to a dielectric layer on a front surface layer of a single crystal semiconductor donor substrate to thereby prepare a bonded structure, wherein the single crystal semiconductor donor substrate comprises two major, generally parallel surfaces, one of which is the front surface of the single crystal semiconductor donor substrate and the other of which is a back surface of the single crystal semiconductor donor substrate, a circumferential edge joining the front and back surfaces of the single crystal semiconductor donor substrate, and a central plane of the single crystal semiconductor donor substrate between the front and back surfaces of the single crystal semiconductor donor substrate, wherein the single crystal semiconductor donor substrate comprises a cleave plane and the dielectric layer on the front surface layer of the single crystal semiconductor donor substrate.

The present invention is still further directed to a method of preparing a silicon-on-insulator structure. The method comprises: bonding a first bonding surface on a front surface layer of a single crystal silicon handle substrate to a second bonding surface on a front surface layer of a single crystal silicon donor substrate; wherein the single crystal silicon handle substrate comprises two major, generally parallel surfaces, one of which is the front surface of the single crystal silicon handle substrate and the other of which is a back surface of the single crystal silicon handle substrate, a circumferential edge joining the front and back surfaces of the single crystal silicon handle substrate, a bulk region between the front and back surfaces, and a central plane of the single crystal silicon handle substrate between the front and back surfaces of the single crystal silicon handle substrate, wherein the single crystal silicon handle substrate has a minimum bulk region resistivity of 100 Ohm-cm, and further wherein a charge trapping layer is in interfacial contact with the front surface layer of the single crystal silicon handle substrate, the charge trapping layer comprising one or more semiconductor layers, wherein each of the one or more semiconductor layers comprise a polycrystalline structure or an amorphous structure and further wherein each of the one or more semiconductor layers comprises a material selected from the group consisting of silicon, SiGe, SiC, and Ge, and further wherein a semiconductor oxide layer is in interfacial contact with the charge trapping layer, the semiconductor oxide layer comprising the first bonding surface; and wherein the single crystal silicon donor substrate comprises two major, generally parallel surfaces, one of which is the front surface of the single crystal silicon donor substrate and the other of which is a back surface of the single crystal silicon donor substrate, a circumferential edge joining the front and back surfaces of the single crystal silicon donor substrate, and a central plane of the single crystal silicon donor substrate between the front and back surfaces of the single crystal silicon donor substrate, wherein the single crystal silicon donor substrate comprises a cleave plane and a dielectric layer on the front surface layer of the single crystal silicon donor substrate, the dielectric layer comprising the second bonding surface.

Other objects and features of this invention will be in part apparent and in part pointed out hereinafter.

DETAILED DESCRIPTION OF THE EMBODIMENT(S) OF THE INVENTION

Figure 1:
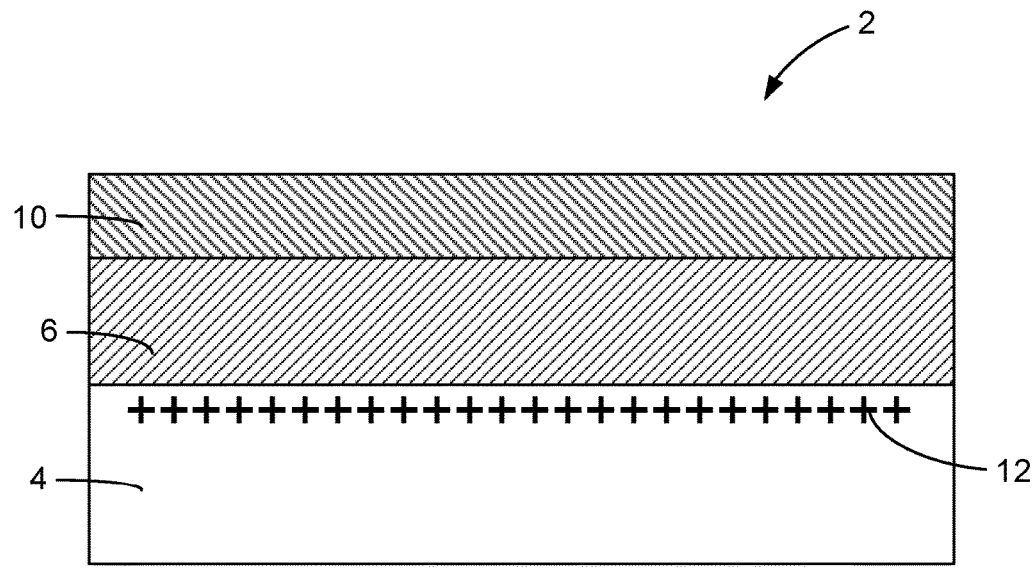
FIG. 1 is a depiction of a silicon-on-insulator wafer comprising a high resistivity substrate and a buried oxide layer.
Figure 2:
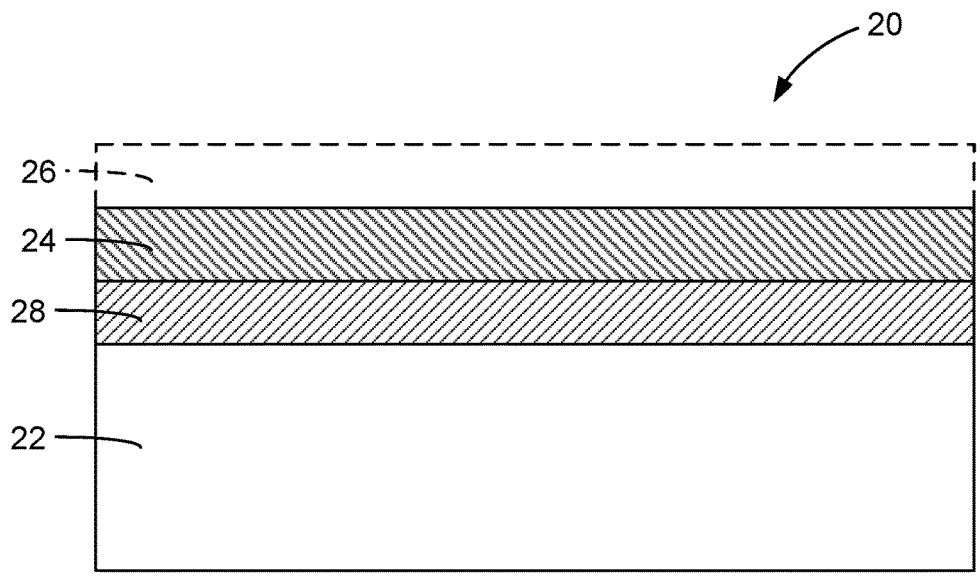
FIG. 2 is a depiction of a silicon-on-insulator wafer according to the prior art, the SOI wafer comprising a polycrystalline silicon charge trapping layer between a high resistivity substrate and a buried oxide layer.

According to the present invention, a method is provided for producing a charge trapping layer on a single crystal semiconductor handle substrate, e.g., a single crystal semiconductor handle wafer, such as a single crystal silicon handle wafer. The single crystal semiconductor handle wafer comprising the charge trapping layer is useful in the production of a semiconductor-on-insulator (e.g., silicon-on-insulator) structure. According to the present invention, the charge trapping layer in the single crystal semiconductor handle wafer is formed at the region near the oxide interface. Advantageously, the method of the present invention provides a charge trapping layer that is stable against thermal processing, such as subsequent thermal process steps in the production of the semiconductor-on-insulator substrate and device manufacture.

In some embodiments, the method of the present invention is directed to producing a charge trapping layer at the handle/buried oxide ("BOX") interface of a semiconductor-on-insulator (e.g., silicon-on-insulator) structure. According to the method of the present invention, a charge trapping layer comprising one or more layers of a semiconductor material such as silicon, SiGe, SiC, and Ge, which may be polycrystalline or amorphous, is deposited onto an exposed front surface of a single crystal semiconductor handle substrate, e.g., a wafer, having a high resistivity. The charge trapping layer comprising amorphous or polycrystalline semiconductor material acts as a high density trap region to kill the conductivity in the handle substrate at the interface with the BOX and prevent the formation of induced charge inversion or accumulation layers that can contribute to power loss and non-linear behavior in electronic devices designed for RF operation. According to the present invention, the charge trapping layer is oxidized prior to bonding with a single crystal semiconductor donor substrate such that the polycrystalline or amorphous charge trapping layer (e.g., a polycrystalline or amorphous silicon charge trapping layer) comprises an oxide layer (a semiconductor oxide layer, e.g., a silicon dioxide layer) of a thickness greater than 0.1 micrometer. In some embodiments, the charge trapping layer is oxidized prior to bonding with a single crystal semiconductor donor substrate such that the polycrystalline or amorphous charge trapping layer (e.g., a polycrystalline or amorphous silicon charge trapping layer) comprises an oxide layer (a semiconductor oxide layer, e.g., a silicon dioxide layer) of a thickness no greater than about 10 micrometers. Accordingly, the oxide layer (a semiconductor oxide layer, e.g., a silicon dioxide layer) in contact with the polycrystalline or amorphous charge trapping layer (e.g., a polycrystalline or amorphous silicon charge trapping layer) may have a thickness between about 0.1 micrometer and about 10 micrometers, such as between about 0.1 micrometers and about 4 micrometers, such as between about 0.1 micrometers and about 2 micrometers, or between about 0.1 micrometers and about 1 micrometer.

Advantageously, by forming a charge trapping layer comprising one or more layers of semiconductor material such as silicon, SiGe, SiC, and Ge, which may be polycrystalline or amorphous, on the front surface of a high resistivity single crystal semiconductor substrate and by oxidizing the charge trapping layer to form a semiconductor oxide layer (e.g., a silicon dioxide layer, a germanium dioxide layer, a silicon germanium dioxide layer) on the handle substrate comprising the charge trapping layer, the charge trapping layer is more thermally stable to the high temperature thermal budget of SOI fabrication compared to a polycrystalline silicon charge trapping layer that is not oxidized prior to bonding with a single crystal semiconductor donor substrate. A polycrystalline silicon charge trapping layer, for example, may be thermally unstable to the high temperature thermal budget in that a portion of the individual polycrystalline silicon grains have a tendency to dissolve at the high temperatures of semiconductor-on-insulator (e.g., silicon-on-insulator) fabrication (typically, up to or even exceeding 1100° C.) while some polycrystalline silicon grains grow in size upon cooling until the grains grow in size toward or even essentially matching the total thickness of charge trapping layer. The tendency of polycrystalline silicon grains to grow during thermal processing of the semiconductor-on-insulator (e.g., silicon-on-insulator) structure, which is observed starting at temperatures as low as 600° C., reduces the overall defectivity of the charge trapping layer, which in turn reduces the charge trapping efficiency of the charge trapping layer.

According to the method of the present invention, deposition of semiconductor material such as silicon, SiGe, SiC, and Ge, which may be polycrystalline or amorphous, to form the charge trapping layer is followed by oxidation in order to form an oxide layer (e.g., a silicon dioxide layer, a germanium dioxide layer, a silicon germanium dioxide layer) on the charge trapping layer on the single crystal semiconductor handle substrate. The oxide layer (e.g., a silicon dioxide layer, a germanium dioxide layer, a silicon germanium dioxide layer) has been determined to cause oxygen atoms to poison or passivate the grain boundaries of the charge trapping layer semiconductor material prior. By poisoning the grain boundaries, the diffusion of silicon and/or germanium atoms through grain boundaries is slowed, and recrystallization is reduced. According to current understanding and results to date, the poisoning of the grain boundaries by oxygen atoms improves the thermal stability of the charge trapping layer and thus improves the efficiency of the charge trapping layer. Accordingly, the final semiconductor-on-insulator structure retains a much higher overall level of defectivity compared to the prior art process in which a single layer of polycrystalline silicon comprises the entirety of the charge trapping layer.

Oxidation of the charge trapping layer, e.g., a polycrystalline silicon layer, prior to bonding with the single crystal semiconductor donor substrates may additionally enhance contamination control. In this regard, background impurities may and often normally deposit on exposed surfaces at uncontrolled level. High temperature processing in SOI structure manufacturing may cause impurity diffusion that is accompanied by polycrystalline silicon resistivity reduction and enhanced polycrystalline silicon recrystallization. These factors may contribute to degraded performance of the charge trapping layer. In embodiments wherein the charge trapping layer is oxidized to form a semiconductor oxide film (e.g., a silicon dioxide layer, a germanium dioxide layer, a silicon germanium dioxide layer) on the charge trapping layer, the growing oxide accumulates many types of background impurities, such as Boron, and blocks other impurities from the diffusion into the charge trapping layer, e.g., polycrystalline silicon charge trapping layer. Additionally, pre-bonding and bonding processes may contaminate the surfaces of wafers. Forming a semiconductor oxide layer (e.g., a silicon dioxide layer, a germanium dioxide layer, a silicon germanium dioxide layer) film on the surface of the charge trapping layer comprising, e.g., polycrystalline silicon, seals all such contamination within the oxide and prevents the diffusion of contaminating impurities into the charge trapping layer.

Still further, the method of the present invention may contribute to control over bow of the semiconductor-on-insulator structure, e.g., silicon-on-insulator. In this regard, due to the difference in the coefficients of thermal expansion between silicon oxide and silicon, for example, high intrinsic stresses develop in the oxide films on silicon wafers. In embodiments wherein the buried oxide film (i.e., the "BOX") is contributed by oxide on the surface of the donor structure, the final semiconductor-on-insulator structure has oxide from one wafer only and, therefore, it is deformed by the oxide stresses. In embodiments of the invention in which the buried oxide layer is contributed, at least partially, by the handle substrate, the oxide grown on the backside of the handle wafer balances the SOI wafer stress state and reduces its bow or warp.

Finally, it has been observed that post-processing of the charge trapping layer, e.g., polycrystalline silicon, may be reduced in the method of the present invention. In this regard, chemical mechanical polishing ("CMP") may be omitted. In embodiments in which CMP is omitted, the interface between the buried oxide and the charge trapping layer in the final structure is highly rough. The rough interface benefits by reducing polycrystalline silicon conductivity due to charge carrier scattering at the rough interface. This improves RF device performance.

The substrates for use in the present invention include a semiconductor handle substrate, e.g., a single crystal semiconductor handle wafer and a semiconductor donor substrate, e.g., a single crystal semiconductor donor wafer. The semiconductor device layer in a semiconductor-on-insulator composite structure is derived from the single crystal semiconductor donor wafer. The semiconductor device layer may be transferred onto the semiconductor handle substrate by wafer thinning techniques such as etching a semiconductor donor substrate or by cleaving a semiconductor donor substrate comprising a damage plane. In general, the single crystal semiconductor handle wafer and single crystal semiconductor donor wafer comprise two major, generally parallel surfaces. One of the parallel surfaces is a front surface of the substrate, and the other parallel surface is a back surface of the substrate. The substrates comprise a circumferential edge joining the front and back surfaces, a bulk region between the front and back surfaces, and a central plane between the front and back surfaces. The substrates additionally comprise an imaginary central axis perpendicular to the central plane and a radial length that extends from the central axis to the circumferential edge. In addition, because semiconductor substrates, e.g., silicon wafers, typically have some total thickness variation (TTV), warp, and bow, the midpoint between every point on the front surface and every point on the back surface may not precisely fall within a plane. As a practical matter, however, the TTV, warp, and bow are typically so slight that to a close approximation the midpoints can be said to fall within an imaginary central plane which is approximately equidistant between the front and back surfaces.

Prior to any operation as described herein, the front surface and the back surface of the substrate may be substantially identical. A surface is referred to as a "front surface" or a "back surface" merely for convenience and generally to distinguish the surface upon which the operations of method of the present invention are performed. In the context of the present invention, a "front surface" of a single crystal semiconductor handle substrate, e.g., a single crystal silicon handle wafer, refers to the major surface of the substrate that becomes an interior surface of the bonded structure. It is upon this front surface that the charge trapping layer is formed. Accordingly, a "back surface" of a single crystal semiconductor handle substrate, e.g., a handle wafer, refers to the major surface that becomes an exterior surface of the bonded structure. Similarly, a "front surface" of a single crystal semiconductor donor substrate, e.g., a single crystal silicon donor wafer, refers to the major surface of the single crystal semiconductor donor substrate that becomes an interior surface of the bonded structure. The front surface of a single crystal semiconductor donor substrate often comprises a dielectric layer, e.g., a silicon dioxide layer, which forms the buried oxide (BOX) layer in the final structure. A "back surface" of a single crystal semiconductor donor substrate, e.g., a single crystal silicon donor wafer, refers to the major surface that becomes an exterior surface of the bonded structure. Upon completion of conventional bonding and wafer thinning steps, the single crystal semiconductor donor substrate forms the semiconductor device layer of the semiconductor-on-insulator (e.g., silicon-on-insulator) composite structure.

The single crystal semiconductor handle substrate and the single crystal semiconductor donor substrate may be single crystal semiconductor wafers. In preferred embodiments, the semiconductor wafers comprise a semiconductor material selected from the group consisting of silicon, silicon carbide, silicon germanium, gallium arsenide, gallium nitride, indium phosphide, indium gallium arsenide, germanium, and combinations thereof. The single crystal semiconductor wafers, e.g., the single crystal silicon handle wafer and single crystal silicon donor wafer, of the present invention typically have a nominal diameter of at least about 150 mm, at least about 200 mm, at least about 300 mm, or at least about 450 mm. Wafer thicknesses may vary from about 250 micrometers to about 1500 micrometers, such as between about 300 micrometers and about 1000 micrometers, suitably within the range of about 500 micrometers to about 1000 micrometers. In some specific embodiments, the wafer thickness may be about 725 micrometers.

In particularly preferred embodiments, the single crystal semiconductor wafers comprise single crystal silicon wafers which have been sliced from a single crystal ingot grown in accordance with conventional Czochralski crystal growing methods or float zone growing methods. Such methods, as well as standard silicon slicing, lapping, etching, and polishing techniques are disclosed, for example, in F. Shimura, Semiconductor Silicon Crystal Technology, Academic Press, 1989, and Silicon Chemical Etching, (J. Grabmaier ed.) Springer-Verlag, N.Y., 1982 (incorporated herein by reference). Preferably, the wafers are polished and cleaned by standard methods known to those skilled in the art. See, for example, W. C. O'Mara et al., *Handbook of Semiconductor Silicon Technology*, Noyes Publications. If desired, the wafers can be cleaned, for example, in a standard SC1/SC2 solution. In some embodiments, the single crystal silicon wafers of the present invention are single crystal silicon wafers which have been sliced from a single crystal ingot grown in accordance with conventional Czochralski ("Cz") crystal growing methods, typically having a nominal diameter of at least about 150 mm, at least about 200 mm, at least about 300 mm, or at least about 450 mm. Preferably, both the single crystal silicon handle wafer and the single crystal silicon donor wafer have mirror-polished front surface finishes that are free from surface defects, such as scratches, large particles, etc. Wafer thickness may vary from about 250 micrometers to about 1500 micrometers, such as between about 300 micrometers and about 1000 micrometers, suitably within the range of about 500 micrometers to about 1000 micrometers. In some specific embodiments, the wafer thickness may be about 725 micrometers.

In some embodiments, the single crystal semiconductor handle substrate and the single crystal semiconductor donor substrate, i.e., single crystal semiconductor handle wafer and single crystal semiconductor donor wafer, comprise interstitial oxygen in concentrations that are generally achieved by the Czochralski-growth method. In some embodiments, the semiconductor wafers comprise oxygen in a concentration between about 4 PPMA and about 18 PPMA. In some embodiments, the semiconductor wafers comprise oxygen in a concentration between about 10 PPMA and about 35 PPMA. Preferably, the single crystal silicon handle wafer comprises oxygen in a concentration of no greater than about 10 PPMA. Interstitial oxygen may be measured according to SEMI MF 1188-1105.

In some embodiments, the semiconductor handle substrate, e.g., a single crystal semiconductor handle substrate, such as a single crystal silicon handle wafer, has a relatively high minimum bulk resistivity. High resistivity wafers are generally sliced from single crystal ingots grown by the Czochralski method or float zone method. Cz-grown silicon wafers may be subjected to a thermal anneal at a temperature ranging from about 600° C. to about 1000° C. in order to annihilate thermal donors caused by oxygen that are incorporated during crystal growth. In some embodiments, the single crystal semiconductor handle wafer has a minimum bulk resistivity of at least 100 Ohm-cm, at least about 500 Ohm-cm, at least about 1000 Ohm-cm, or even at least about 3000 Ohm-cm, such as between about 100 Ohm-cm and about 100,000 Ohm-cm, or between about 500 Ohm-cm and about 100,000 Ohm-cm, or between about 1000 Ohm-cm and about 100,000 Ohm-cm, or between about 500 Ohm-cm and about 10,000 Ohm-cm, or between about 750 Ohm-cm and about 10,000 Ohm-cm, between about 1000 Ohm-cm and about 10,000 Ohm-cm, between about 2000 Ohm-cm and about 10,000 Ohm-cm, between about 3000 Ohm-cm and about 10,000 Ohm-cm, or between about 3000 Ohm-cm and about 5,000 Ohm-cm. Methods for preparing high resistivity wafers are known in the art, and such high resistivity wafers may be obtained from commercial suppliers, such as SunEdison Semiconductor Ltd. (St. Peters, Mo.; formerly MEMC Electronic Materials, Inc.).

In some embodiments, the single crystal semiconductor handle wafer surface could be intentionally damaged by a sound blasting process or by a caustic etch.

In some embodiments, the front surface of the semiconductor handle wafer is treated to form an interfacial layer prior to formation of the charge trapping layer. The interfacial layer may comprise a material selected from silicon dioxide, silicon nitride, and silicon oxynitride. In some preferred embodiments, the interfacial layer may comprise silicon dioxide. In order to form a silicon dioxide interfacial layer, the front surface of the semiconductor handle wafer is oxidized prior to formation of the charge trapping layer such that the front surface of the wafer comprises an oxide film. In some embodiments, the interfacial layer comprises silicon dioxide, which may be formed by oxidizing the front surface of the semiconductor handle substrate. This may be accomplished by means known in the art, such as thermal oxidation (in which some portion of the deposited semiconductor material film will be consumed) or CVD oxide deposition. In some embodiments, the single crystal semiconductor handle substrate, e.g., a single crystal silicon handle wafer, may be thermally oxidized in a furnace such as an ASM A400. The temperature may range from 750° C. to 1200° C. in an oxidizing ambient. The oxidizing ambient atmosphere can be a mixture of inert gas, such as Ar or $N_2$, and $O_2$. The oxygen content may vary from 1 to 10 percent, or higher. In some embodiments, the oxidizing ambient atmosphere may be up to 100% (a "dry oxidation"). In an exemplary embodiment, semiconductor handle wafers may be loaded into a vertical furnace, such as an A400. The temperature is ramped to the oxidizing temperature with a mixture of $N_2$ and $O_2$. After the desired oxide thickness has been obtained, the $O_2$ is turned off and the furnace temperature is reduced and wafers are unloaded from the furnace. In order to incorporate nitrogen in the interfacial layer to deposit silicon nitride or silicon oxynitride, the atmosphere may comprise nitrogen alone or a combination of oxygen and nitrogen, and the temperature may be increased to a temperature between 1100° C. and 1400° C. An alternative nitrogen source is ammonia. In some embodiments, the handle substrates are oxidized to provide an oxide layer of at least about 7 angstroms thick, such as between about 7 angstroms and about 20 angstroms, or between about 10 angstroms and about 20 angstroms.

According to the method of the present invention, semiconductor material is deposited onto the exposed front surface of the single crystal semiconductor handle wafer, which preferably comprises an exposed oxidized front surface layer. Semiconductor material suitable for use in forming a charge trapping layer in a semiconductor-on-insulator device is suitably capable of forming a highly defective layer in the fabricated device. Such materials include polycrystalline semiconductor materials and amorphous semiconductor materials. Materials that may be polycrystalline or amorphous include silicon (Si), silicon germanium (SiGe), silicon doped with carbon (SiC), and germanium (Ge). Polycrystalline silicon denotes a material comprising small silicon crystals having random crystal orientations. Polycrystalline silicon grains may be as small in size as about 20 nanometers. According to the method of the present invention, the smaller the crystal grain size of polycrystalline silicon deposited the higher the defectivity in the charge trapping layer. Amorphous silicon comprises a non-crystalline allotropic form of silicon, which lacks short range and long range order. Silicon grains having crystallinity over no more than about 10 nanometers may also be considered essentially amorphous. Silicon germanium comprises an alloy of silicon germanium in any molar ratio of silicon and germanium. Silicon doped with carbon comprises a compound of silicon and carbon, which may vary in molar ratio of silicon and carbon. Preferably, the charge trapping layer has a resistivity at least about 1000 Ohm-cm, or at least about 3000 Ohm-cm, such as between about 1000 Ohm-cm and about 100,000 Ohm-cm, between about 1000 Ohm-cm and about 10,000 Ohm-cm, between about 2000 Ohm-cm and about 10,000 Ohm-cm, between about 3000 Ohm-cm and about 10,000 Ohm-cm, or between about 3000 Ohm-cm and about 5,000 Ohm-cm.

The material for deposition onto the, optionally oxidized, front surface of the single crystal semiconductor handle wafer may be deposited by means known in the art. For example, the semiconductor material may be deposited using metalorganic chemical vapor deposition (MOCVD), physical vapor deposition (PVD), chemical vapor deposition (CVD), low pressure chemical vapor deposition (LPCVD), plasma enhanced chemical vapor deposition (PECVD), or molecular beam epitaxy (MBE). Silicon precursors for LPCVD or PECVD include methyl silane, silicon tetrahydride (silane), trisilane, disilane, pentasilane, neopentasilane, tetrasilane, dichlorosilane ($SiH_2Cl_2$), silicon tetrachloride ($SiCl_4$), among others. For example, polycrystalline silicon may be deposited onto the surface oxidation layer by pyrolyzing silane ($SiH_4$) in a temperature range between about 550° C. and about 690° C., such as between about 580° C. and about 650° C. The chamber pressure may range from about 70 to about 400 mTorr. Amorphous silicon may be deposited by plasma enhanced chemical vapor deposition (PECVD) at temperatures generally ranging between about 75° C. and about 300° C. Silicon germanium, particularly amorphous silicon germanium, may be deposited at temperatures up to about 300° C. by chemical vapor deposition by including organogermanium compounds, such as isobutylgermane, alkylgermanium trichlorides, and dimethylaminogermanium trichloride. Silicon doped with carbon may be deposited by thermal plasma chemical vapor deposition in epitaxial reactors using precursors such as silicon tetrachloride and methane. Suitable carbon precursors for CVD or PECVD include methylsilane, methane, ethane, ethylene, among others. For LPCVD deposition, methylsilane is a particularly preferred precursor since it provides both carbon and silicon. For PECVD deposition, the preferred precursors include silane and methane. In some embodiments, the silicon layer may comprise a carbon concentration of at least about 1% on an atomic basis, such as between about 1% on an atomic basis and about 10% on an atomic basis.

In some embodiments, the deposition of the semiconductor material of the charge trap layer may be temporarily interrupted, at least once and preferably more than once, in order to prepare multiple layers of charge trapping material. The interim surface of the semiconductor material film may be exposed to inert, oxidizing, nitridizing, or passivating atmosphere to thereby poison or passivate the deposited semiconductor material. Stated another way, the method of the present invention may comprise deposition of a multilayer of charge trapping semiconductor material by a cycling process in which semiconductor material is deposited, deposition is interrupted, the layer of semiconductor material is poisoned or passivated, and the next layer of semiconductor material is deposited. In some embodiments, a multilayer may be formed comprising one passivated semiconductor layer and one additional semiconductor layer may be deposited to form the charge trapping layer. In some embodiments, the multilayer comprises more than one passivated semiconductor layer and one additional semiconductor layer in the charge trapping layer. By depositing the charge trapping layer in this way, a multilayer comprising, for example, one or more passivated layers, or two or more passivated layers, such as three or more passivated layers, such as at least four passivated layers, or between four and about 100 passivated layers, or between four and about 60 passivated layers, or between four and about 50 passivated layers, or between four and about 25 passivated layers, or between six and about 20 passivated layers of semiconductor material is deposited onto the handle substrate. A large number of semiconductor layers may be deposited limited in part by throughput demands and by the smallest practical layer thickness that may be deposited, which is currently about 20 nanometers. Each of these layers of semiconductor material is poisoned or passivated such that during the high temperature processes of semiconductor-on-insulator fabrication, crystal grain growth in each layer of the multilayer is limited by the thickness of the passivated multilayer rather than by the thickness of the overall charge trapping layer as in prior art processes. In some embodiments, the semiconductor layers may be passivated by exposing the first semiconductor layer to an atmosphere comprising a nitrogen-containing gas, such as nitrogen, nitrous oxide, ammonia ($NH_3$), nitrogen plasma, and any combination thereof. In this regard, the atmosphere in which the semiconductor layer is deposited may comprise a nitrogen-containing gas, such as nitrogen, and termination of the deposition process followed by exposure to the gas may be sufficient to form a thin passivation layer over the semiconductor layer. In some embodiments, the chamber may be evacuated of the deposition gas and purged with the nitrogen containing gas in order to effect passivation of the previously deposited semiconductor layer. Exposure to nitrogen may nitride the deposited semiconductor layer, for example, resulting in the formation of a thin layer of silicon nitride of just a few angstroms thickness. Alternative passivation methods may be used. For example, the semiconductor layer may be passivated by exposing the first semiconductor layer to an atmosphere comprising an oxygen containing gas, such as oxygen, ozone, water vapor, or any combination thereof. According to these embodiments, a thin layer of semiconductor oxide may form on the semiconductor layer, the semiconductor oxide being sufficient to passivate the layer. For example, a thin layer of silicon oxide may be formed between each layer of the multilayer. The oxide layer may be only a few angstroms thick, such as between about 1 angstrom and about 20 angstroms, or between about 1 angstrom and about 10 angstroms. In some embodiments, air, which comprises both nitrogen and oxygen, may be used as the passivated gas. In some embodiments, the semiconductor layers may be passivated by exposing the first semiconductor layer to a liquid selected from the group consisting of water, peroxide (e.g. hydrogen peroxide solution), or SC1 solution ($NH_3:H_2O_2:H_2O$).

The overall thickness of the charge trapping layer comprising multiple passivated semiconductor layers may be between about 0.3 micrometers and about 5 micrometers, such as between about 0.3 micrometers and about 3 micrometers, such as between about 0.3 micrometers and about 2 micrometers or between about 2 micrometers and about 3 micrometers. If a multilayer approach is employed, each layer of the multilayer may be at least about 5 nanometers thick, such as at least about 20 nanometers thick, such as between about 5 and about 1000 nanometers thick, between about 20 and about 1000 nanometers thick, between about 20 and about 500 nanometers thick, or between about 100 and about 500 nanometers thick. Advantageously, the passivation process imparts additional defectivity into the charge trapping layer.

In some embodiments, the charge trapping layer comprising polycrystalline silicon and/or the other materials disclosed herein may be subjected to chemical mechanical polishing ("CMP"). Chemical mechanical polishing may occur by methods known in the art.

According to the method of the present invention, deposition of the charge trapping layer is followed by formation of a dielectric layer on the surface of the charge trapping layer. In some embodiments, the single semiconductor handle substrate (e.g., single crystal silicon handle substrate) is oxidized to form a semiconductor oxide (e.g., a silicon dioxide) film on the charge trapping layer. In some embodiments, the charge trapping layer, e.g., polycrystalline film, may be thermally oxidized (in which some portion of the deposited semiconductor material film will be consumed) or the semiconductor oxide (e.g., silicon dioxide) film may be grown by CVD oxide deposition. The nature of the semiconductor oxide depends in part on the components of the charge trapping layer. That is, charge trapping layers comprising polycrystalline or amorphous silicon may be oxidized to form silicon dioxide films. The charge trapping layer may additionally or alternatively comprise silicon germanium (SiGe), silicon doped with carbon (SiC), and germanium (Ge), which would yield semiconductor oxide layers comprising oxides of SiGe, SiC, and/or Ge. In some embodiments, the single crystal semiconductor handle substrate comprising the charge trapping layer may be thermally oxidized in a furnace such as an ASM A400. The temperature may range from 750° C. to 1200° C. in an oxidizing ambient. The oxidizing ambient atmosphere can be a mixture of inert gas, such as Ar or $N_2$, and $O_2$. The oxygen content may vary from 1 to 10 percent, or higher. In some embodiments, the oxidizing ambient atmosphere may be up to 100% (a "dry oxidation"). In an exemplary embodiment, semiconductor handle wafers comprising the charge trapping layer may be loaded into a vertical furnace, such as an A400. The temperature is ramped to the oxidizing temperature with a mixture of $N_2$ and $O_2$. After the desired oxide thickness has been obtained, the $O_2$ is turned off and the furnace temperature is reduced and wafers are unloaded from the furnace. In order to incorporate nitrogen in the interfacial layer to deposit silicon nitride or silicon oxynitride, the atmosphere may comprise nitrogen alone or a combination of oxygen and nitrogen, and the temperature may be increased to a temperature between 1100° C. and 1400° C. An alternative nitrogen source is ammonia. The oxide layer (e.g., silicon dioxide layer) in contact with the polycrystalline or amorphous charge trapping layer (e.g., a polycrystalline or amorphous silicon charge trapping layer) may have a thickness between about 0.1 micrometer and about 10 micrometers, such as between about 0.1 micrometers and about 4 micrometers, such as between about 0.1 micrometers and about 2 micrometers, or between about 0.1 micrometers and about 1 micrometer. The oxidation process additionally oxidizes the back surface of the single crystal semiconductor handle wafer, which advantageously reduces warp and bow potentially caused by the different coefficients of thermal expansion of silicon and silicon dioxide.

After oxidation of the charge trapping layer, wafer cleaning is optional. If desired, the wafers can be cleaned, for example, in a standard SC1/SC2 solution. Additionally, the wafers, particularly, the silicon dioxide layer on the charge trapping layer, may be subjected to chemical mechanical polishing (CMP) to reduce the surface roughness, preferably to the level of $RMS_{2\times 2 \ \mu m2}$ less than about 5 angstroms, wherein root mean squared $$R_q = \sqrt{\frac{1}{n}\sum_{i=1}^{n} y_i^2},$$

the roughness profile contains ordered, equally spaced points along the trace, and $y_i$ is the vertical distance from the mean line to the data point.

The single crystal semiconductor handle wafer prepared according to the method described herein to comprise a charge trapping layer (e.g., polycrystalline or amorphous silicon) and a semiconductor oxide (e.g., a silicon dioxide) film having a thickness of at least about 0.1 micrometers, is next bonded a single crystal semiconductor donor substrate, e.g., a single crystal semiconductor donor wafer, which is prepared according to conventional layer transfer methods. The single crystal semiconductor donor substrate may be a single crystal semiconductor wafer. In preferred embodiments, the semiconductor wafer comprises a semiconductor material selected from the group consisting of silicon, silicon carbide, silicon germanium, gallium arsenide, gallium nitride, indium phosphide, indium gallium arsenide, germanium, and combinations thereof. Depending upon the desired properties of the final integrated circuit device, the single crystal semiconductor (e.g., silicon) donor wafer may comprise a dopant selected from the group consisting of boron, arsenic, and phosphorus. The resistivity of the single crystal semiconductor (e.g., silicon) donor wafer may range from 1 to 50 Ohm-cm, typically, from 5 to 25 Ohm-cm. The single crystal semiconductor donor wafer may be subjected to standard process steps including oxidation, implant, and post implant cleaning. Accordingly, a semiconductor donor substrate, such as a single crystal semiconductor wafer of a material that is conventionally used in preparation of multilayer semiconductor structures, e.g., a single crystal silicon donor wafer, that has been etched and polished and optionally oxidized, is subjected to ion implantation to form a damage layer in the donor substrate.

In some embodiments, the semiconductor donor substrate comprises a dielectric layer. Suitable dielectric layers may comprise a material selected from among silicon dioxide, silicon nitride, hafnium oxide, titanium oxide, zirconium oxide, lanthanum oxide, barium oxide, and a combination thereof. In some embodiments, the dielectric layer comprises an oxide layer having a thickness of at least about 10 nanometer thick, such as between about 10 nanometers and about 10,000 nanometers, between about 10 nanometers and about 5,000 nanometers, or between about 100 nanometers and about 800 nanometers, such as about 600 nanometers.

In some embodiments, the front surface of the single crystal semiconductor donor substrate (e.g., a single crystal silicon donor substrate) may be thermally oxidized (in which some portion of the deposited semiconductor material film will be consumed) to prepare the semiconductor oxide film, or the semiconductor oxide (e.g., silicon dioxide) film may be grown by CVD oxide deposition. In some embodiments, the front surface of the single crystal semiconductor donor substrate may be thermally oxidized in a furnace such as an ASM A400 in the same manner described above. In some embodiments, the donor substrates are oxidized to provide an oxide layer on the front surface layer of at least about 10 nanometer thick, such as between about 10 nanometers and about 10,000 nanometers, between about 10 nanometers and about 5,000 nanometers, or between about 100 nanometers and about 800 nanometers, such as about 600 nanometers.

Ion implantation may be carried out in a commercially available instrument, such as an Applied Materials Quantum II. Implanted ions include He, H, $H_2$, or combinations thereof. Ion implantation is carried out at a density and duration sufficient to form a damage layer in the semiconductor donor substrate. Implant density may range from about $10^{12}$ ions/cm$^2$ to about $10^{17}$ ions/cm$^2$, such as from about $10^{14}$ ions/cm$^2$ to about $10^{17}$ ions/cm$^2$. Implant energies may range from about 1 keV to about 3,000 keV, such as from about 10 keV to about 3,000 keV. The depth of implantation determines the thickness of the single crystal semiconductor device layer in the final SOI structure. In some embodiments it may be desirable to subject the single crystal semiconductor donor wafers, e.g., single crystal silicon donor wafers, to a clean after the implant. In some preferred embodiments, the clean could include a Piranha clean followed by a DI water rinse and SC1/SC2 cleans.

In some embodiments of the present invention, the single crystal semiconductor donor substrate having an ion implant region therein formed by helium ion and/or hydrogen ion implant is annealed at a temperature sufficient to form a thermally activated cleave plane in the single crystal semiconductor donor substrate. An example of a suitable tool might be a simple Box furnace, such as a Blue M model. In some preferred embodiments, the ion implanted single crystal semiconductor donor substrate is annealed at a temperature of from about 200° C. to about 350° C., from about 225° C. to about 325° C., preferably about 300° C. Thermal annealing may occur for a duration of from about 2 hours to about 10 hours, such as from about 2 hours to about 8 hours. Thermal annealing within these temperatures ranges is sufficient to form a thermally activated cleave plane. After the thermal anneal to activate the cleave plane, the single crystal semiconductor donor substrate surface is preferably cleaned.

In some embodiments, the ion-implanted and optionally cleaned and optionally annealed single crystal semiconductor donor substrate is subjected to oxygen plasma and/or nitrogen plasma surface activation. In some embodiments, the oxygen plasma surface activation tool is a commercially available tool, such as those available from EV Group, such as EVG®810LT Low Temp Plasma Activation System. The ion-implanted and optionally cleaned single crystal semiconductor donor wafer is loaded into the chamber. The chamber is evacuated and backfilled with $O_2$ to a pressure less than atmospheric to thereby create the plasma. The single crystal semiconductor donor wafer is exposed to this plasma for the desired time, which may range from about 1 second to about 120 seconds. Oxygen plasma surface oxidation is performed in order to render the front surface of the single crystal semiconductor donor substrate hydrophilic and amenable to bonding to a single crystal semiconductor handle substrate prepared according to the method described above.

The hydrophilic front surface layer of the single crystal semiconductor donor substrate and the front surface of the single crystal semiconductor handle substrate, which is optionally oxidized, are next brought into intimate contact to thereby form a bonded structure. The bonded structure comprises a dielectric layer, e.g., a buried oxide, with a portion of the dielectric layer contributed by the oxidized front surface of the single crystal semiconductor handle substrate and a portion of the dielectric layer contributed by the oxidized front surface of the single crystal semiconductor donor substrate. In some embodiments, the dielectric layer, e.g., buried oxide layer, has a thickness of at least about 10 nanometer thick, such as between about 10 nanometers and about 10,000 nanometers, between about 10 nanometers and about 5,000 nanometers, or between about 100 nanometers and about 800 nanometers, such as about 600 nanometers.

Since the mechanical bond is relatively weak, the bonded structure is further annealed to solidify the bond between the donor wafer and the handle wafer. In some embodiments of the present invention, the bonded structure is annealed at a temperature sufficient to form a thermally activated cleave plane in the single crystal semiconductor donor substrate. An example of a suitable tool might be a simple Box furnace, such as a Blue M model. In some preferred embodiments, the bonded structure is annealed at a temperature of from about 200° C. to about 350° C., from about 225° C. to about 325° C., preferably about 300° C. Thermal annealing may occur for a duration of from about 0.5 hours to about 10 hour, preferably a duration of about 2 hours. Thermal annealing within these temperatures ranges is sufficient to form a thermally activated cleave plane. After the thermal anneal to activate the cleave plane, the bonded structure may be cleaved.

After the thermal anneal, the bond between the single crystal semiconductor donor substrate and the single crystal semiconductor handle substrate is strong enough to initiate layer transfer via cleaving the bonded structure at the cleave plane. Cleaving may occur according to techniques known in the art. In some embodiments, the bonded structure may be placed in a conventional cleave station affixed to stationary suction cups on one side and affixed by additional suction cups on a hinged arm on the other side. A crack is initiated near the suction cup attachment and the movable arm pivots about the hinge cleaving the wafer apart. Cleaving removes a portion of the semiconductor donor wafer, thereby leaving a semiconductor device layer, preferably a silicon device layer, on the semiconductor-on-insulator composite structure.

After cleaving, the cleaved structure may be subjected to a high temperature anneal in order to further strengthen the bond between the transferred device layer and the single crystal semiconductor handle substrate. An example of a suitable tool might be a vertical furnace, such as an ASM A400. In some preferred embodiments, the bonded structure is annealed at a temperature of from about 1000° C. to about 1200° C., preferably at about 1000° C. Thermal annealing may occur for a duration of from about 0.5 hours to about 8 hours, preferably a duration of about 4 hours. Thermal annealing within these temperatures ranges is sufficient to strengthen the bond between the transferred device layer and the single crystal semiconductor handle substrate.

Figure 3:
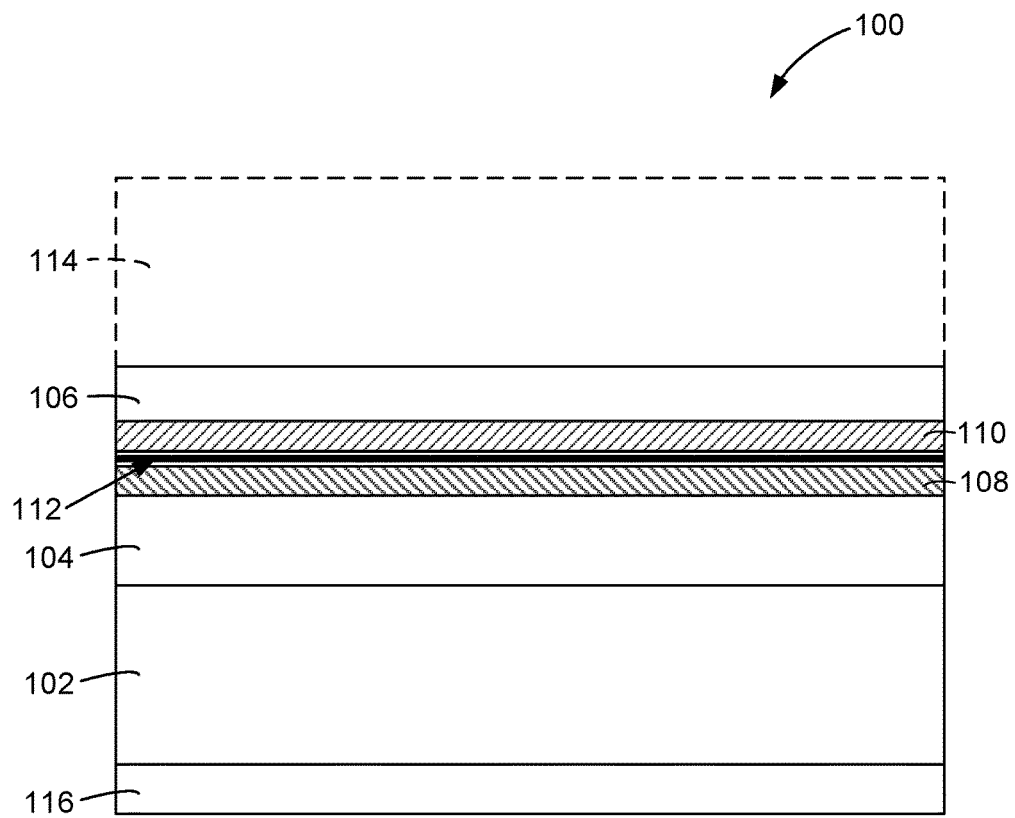
FIG. 3 is a depiction of a silicon-on-insulator wafer according to the method of the present invention. The SOI wafer was prepared as described in Example 1.

After the cleave and high temperature anneal, the bonded structure may be subjected to a cleaning process designed to remove thin thermal oxide and clean particulates from the surface. In some embodiments, the single crystal semiconductor donor wafer may be brought to the desired thickness and smoothness by subjecting to a vapor phase HCl etch process in a horizontal flow single wafer epitaxial reactor using $H_2$ as a carrier gas. In some embodiments, an epitaxial layer may be deposited on the transferred device layer. With reference to FIG. 3, the finished multilayer structure 100 of the invention, i.e., a SOI wafer, comprises the high resistivity single crystal semiconductor handle substrate 102 (e.g., a single crystal silicon handle substrate), a charge trapping layer 104, a semiconductor oxide 108 (e.g., silicon dioxide layer) prepared from oxidation of the charge trapping layer 104, a dielectric layer 110 (e.g., buried oxide layer) prepared from oxidation of the single crystal semiconductor donor substrate, and the semiconductor device layer 106 (prepared by thinning the donor substrate). The bonding surface 112 is shown between the first oxide layer 108 and the second oxide layer 110. Oxidation further forms the backside oxide layer 116, which is advantageous for reducing wafer bow. The final structure may then be subjected to end of line metrology inspections and cleaned a final time using typical SC1-SC2 process.

Having described the invention in detail, it will be apparent that modifications and variations are possible without departing from the scope of the invention defined in the appended claims.

The following non-limiting examples further illustrate the present invention.

EXAMPLE 1

A multilayer structure 100 of the invention is illustrated in FIG. 3. The multilayer structure 100 comprises a high resistivity silicon substrate 102 having a backside oxide layer 116, a charge trapping layer 104, and a silicon device layer 106. Two oxide layers 108, 110 lie between the charge trapping layer 104 and the silicon device layer 106. The first oxide layer 108 is grown by thermal oxidation of the charge trapping layer 104. The second oxide layer 110 is grown by CVD oxidation of the silicon donor wafer in a chemical vapor deposition (CVD) system. The bonding surface 112 is shown between the first oxide layer 108 and the second oxide layer 110. The removed portion of the donor wafer 114 is shown for reference. The multilayer structure 100 of the Example was prepared according to the following protocol.

200 mm single side polished high resistivity single crystal silicon wafer substrate 102 with resistivity >500 Ohm-cm, or >1000 Ohm-cm, or >3000 Ohm-cm (SunEdison, Inc.; St. Peters, Mo.) was provided. A charge trapping layer 104 comprising polycrystalline silicon was deposited on the front surface of the single crystal silicon handle wafer 102. The charge trapping layer 104 was deposited in LPCVD reactor in a temperature range between 550 and 690° C. and tube pressure ranging from 70 to 400 mTorr. A preferred LPCVD reactor is a vertical reactor with three injection points, but the same result could also be reached in other vertical reactors or horizontal furnaces. The charge trapping layer 104 was optionally chemical mechanical polished. Next, the polycrystalline silicon charge trapping layer 104 was subjected to thermal oxidation to form the first oxide layer 108 to an oxide thickness to >0.1 μm. Oxidation further forms the backside oxide layer 116, which is advantageous for reducing wafer bow. The first oxide layer 108 was chemical-mechanical polished to achieve the level of its roughness $RMS_{2\times 2\ \mu m2}$<5 A. The single crystal silicon wafer substrate 102 comprising the charge trapping layer 104 and the first oxide layer 108 is next bonded to a donor wafer 114 comprising a second oxide layer 110. Before bonding, the donor wafers receive oxidation; implantation with $He^+$ and $H^+$ (or $H2^+$) ions; and anneal. The donor wafers 114 are mechanically cleaved leaving a thin top silicon layer 106 on the surface of handle substrate 102 with the deposited semiconductor material CTL 104 underneath of first oxide layer 108 and second oxide layer 110, which becomes BOX. Optionally, the top silicon layer is thinned to a desired thickness; the top silicon layer may be smoothed to meet SOI surface roughness requirement; and optionally, an epitaxial layer is grown on the top SOI.

As various changes could be made in the above compositions and processes without departing from the scope of the invention, it is intended that all matter contained in the above description be interpreted as illustrative and not in a limiting sense.

When introducing elements of the present invention or the preferred embodiment(s) thereof, the articles "a," "an," "the," and "said" are intended to mean that there are one or more of the elements. The terms "comprising," "including,"

What is claimed is:

1. A method of preparing a semiconductor-on-insulator device, the method comprising:

forming a charge trapping multilayer on a front surface of a single crystal semiconductor handle substrate, wherein the single crystal semiconductor handle substrate comprises two major, generally parallel surfaces, one of which is the front surface of the single crystal semiconductor handle substrate and the other of which is a back surface of the single crystal semiconductor handle substrate, a circumferential edge joining the front and back surfaces of the single crystal semiconductor handle substrate, a bulk region between the front and back surfaces, and a central plane of the single crystal semiconductor handle substrate between the front and back surfaces of the single crystal semiconductor handle substrate, wherein the single crystal semiconductor handle substrate has a minimum bulk region resistivity of 100 Ohm-cm and further wherein the charge trapping multilayer comprises two or more passivated semiconductor layers, wherein each of the two or more passivated semiconductor layers comprises a semiconductor layer comprising a polycrystalline structure or an amorphous structure and comprising a material selected from the group consisting of silicon, SiGe, SiC, and Ge, and each of the two or more passivated semiconductor layers comprises a passivation layer comprising a semiconductor nitride or a semiconductor oxide, wherein a thickness of each of the two or more passivated semiconductor layers is between about 20 nanometers and about 1000 nanometers thick, and the charge trapping multilayer has a resistivity greater than about 1000 Ohm-cm;

forming a semiconductor oxide layer on the charge trapping multilayer, wherein the semiconductor oxide layer has a thickness of at least about 0.1 micrometers; and bonding the semiconductor oxide layer to a dielectric layer on a front surface of a single crystal semiconductor donor substrate to thereby prepare a bonded structure, wherein the single crystal semiconductor donor substrate comprises two major, generally parallel surfaces, one of which is the front surface of the single crystal semiconductor donor substrate and the other of which is a back surface of the single crystal semiconductor donor substrate, a circumferential edge joining the front and back surfaces of the single crystal semiconductor donor substrate, and a central plane of the single crystal semiconductor donor substrate between the front and back surfaces of the single crystal semiconductor donor substrate, wherein the single crystal semiconductor donor substrate comprises a cleave plane and the dielectric layer on the front surface of the single crystal semiconductor donor substrate.

2. The method of claim 1 wherein the single crystal semiconductor handle substrate comprises a semiconductor material selected from the group consisting of silicon, silicon carbide, silicon germanium, gallium arsenide, gallium nitride, indium phosphide, indium gallium arsenide, germanium, and combinations thereof.

3. The method of claim 1 wherein the single crystal semiconductor handle substrate comprises a single crystal silicon wafer sliced from a single crystal silicon ingot grown by a Czochralski method or a float zone method.

4. The method of claim 1 wherein the single crystal semiconductor handle substrate has a bulk resistivity between about 100 Ohm-cm and about 100,000 Ohm-cm.

5. The method of claim 1 wherein the single crystal semiconductor handle substrate has a bulk resistivity between about 2000 Ohm-cm and about 10,000 Ohm-cm.

6. The method of claim 1 wherein the single crystal semiconductor handle substrate has a bulk resistivity between about 3000 Ohm-cm and about 5,000 Ohm-cm.

7. The method of claim 1 wherein the charge trapping multilayer has a resistivity greater than about 3000 Ohm-cm.

8. The method of claim 1 wherein the charge trapping multilayer layer has a resistivity between about 2000 Ohm-cm and about 10,000 Ohm-cm.

9. The method of claim 1 wherein the charge trapping multilayer has a resistivity between about 3000 Ohm-cm and about 10,000 Ohm-cm.

10. The method of claim 1 wherein the charge trapping multilayer layer has a resistivity between about 3000 Ohm-cm and about 5,000 Ohm-cm.

11. The method of claim 1 wherein a total thickness of the charge trapping multilayer is between about 0.3 micrometers and about 5 micrometers.

12. The method of claim 1 wherein a total thickness of the charge trapping multilayer is between about 0.3 micrometers and about 2 micrometers.

13. The method of claim 1 wherein the charge trapping multilayer comprises layers between four and about 100 passivated semiconductor layers, wherein each of the layers between four and about 100 passivated semiconductor layers is passivated.

14. The method of claim 1 wherein the charge trapping multilayer comprises SiGe, as a polycrystalline structure or an amorphous structure.

15. The method of claim 1 wherein the charge trapping multilayer comprises SiC, as a polycrystalline structure or an amorphous structure.

16. The method of claim 1 wherein the charge trapping multilayer comprises Ge, as a polycrystalline structure or an amorphous structure.

17. The method of claim 1 wherein the semiconductor oxide layer in interfacial contact with the charge trapping multilayer has a thickness between about 0.1 micrometer and about 10 micrometers.

18. The method of claim 1 wherein the semiconductor oxide layer in interfacial contact with the charge trapping multilayer has a thickness between about 0.1 micrometer and about 2 micrometers.

19. The method of claim 1 wherein the dielectric layer has a thickness between about 10 nanometers and about 10,000 nanometers.

20. The method of claim 1 wherein the single crystal semiconductor donor substrate comprises a semiconductor material selected from the group consisting of silicon, silicon carbide, silicon germanium, gallium arsenide, gallium nitride, indium phosphide, indium gallium arsenide, germanium, and combinations thereof.

21. The method of claim 1 wherein the single crystal semiconductor donor substrate has a resistivity between about 1 and about 50 Ohm-cm.

22. The method of claim 1 further comprising heating the bonded structure at a temperature and for a duration sufficient to strengthen the bond between the dielectric layer of the single crystal semiconductor donor structure and the semiconductor oxide layer on the front surface of the single crystal semiconductor handle substrate.

23. The method of claim 1 further comprising:
mechanically cleaving the bonded structure at the cleave plane of the single crystal semiconductor donor substrate to thereby prepare the semiconductor-on-insulator device comprising the single crystal semiconductor handle substrate, the charge trapping multilayer, the semiconductor oxide layer, the dielectric layer in contact with the semiconductor oxide layer, and a single crystal semiconductor device layer in contact with the dielectric layer; and
heating the cleaved structure at a temperature and for a duration sufficient to strengthen the bond.

24. A method of preparing a silicon-on-insulator structure, the method comprising:
bonding a first bonding surface on a front surface of a single crystal silicon handle substrate to a second bonding surface on a front surface of a single crystal silicon donor substrate;
wherein the single crystal silicon handle substrate comprises two major, generally parallel surfaces, one of which is the front surface of the single crystal silicon handle substrate and the other of which is a back surface of the single crystal silicon handle substrate, a circumferential edge joining the front and back surfaces of the single crystal silicon handle substrate, a bulk region between the front and back surfaces, and a central plane of the single crystal silicon handle substrate between the front and back surfaces of the single crystal silicon handle substrate, wherein the single crystal silicon handle substrate has a minimum bulk region resistivity of 100 Ohm-cm, and further wherein a charge trapping multilayer is in interfacial contact with the front surface of the single crystal silicon handle substrate, the charge trapping multilayer comprising two or more passivated semiconductor layers, wherein each of the two or more passivated semiconductor layers comprises a polycrystalline structure or an amorphous structure and comprises a material selected from the group consisting of silicon, SiGe, SiC, and Ge, and each of the two or more passivated semiconductor layers comprises a passivation layer comprising a semiconductor nitride or a semiconductor oxide, wherein a thickness of each of the two or more passivated semiconductor layers is between about 20 nanometers and about 1000 nanometers thick, and the charge trapping multilayer has a resistivity greater than about 1000 Ohm-cm, and further wherein a semiconductor oxide layer is in interfacial contact with the charge trapping multilayer, the semiconductor oxide layer comprising the first bonding surface; and
wherein the single crystal silicon donor substrate comprises two major, generally parallel surfaces, one of which is the front surface of the single crystal silicon donor substrate and the other of which is a back surface of the single crystal silicon donor substrate, a circumferential edge joining the front and back surfaces of the single crystal silicon donor substrate, and a central plane of the single crystal silicon donor substrate between the front and back surfaces of the single crystal silicon donor substrate, wherein the single crystal silicon donor substrate comprises a cleave plane and a dielectric layer on the front surface of the single crystal silicon donor substrate, the dielectric layer comprising the second bonding surface.

25. The method of claim 24 wherein the single crystal silicon handle substrate comprises a single crystal silicon wafer sliced from a single crystal silicon ingot grown by a Czochralski method or a float zone method.

26. The method of claim 24 wherein the single crystal silicon handle substrate has a bulk resistivity between about 100 Ohm-cm and about 100,000 Ohm-cm.

27. The method of claim 24 wherein the single crystal silicon handle substrate has a bulk resistivity between about 1000 Ohm-cm and about 10,000 Ohm-cm.

28. The method of claim 24 wherein the charge trapping multilayer has a resistivity greater than about 3000 Ohm-cm.

29. The method of claim 24 wherein the charge trapping multilayer has a resistivity between about 2000 Ohm-cm and about 10,000 Ohm-cm.

30. The method of claim 24 wherein the charge trapping multilayer has a resistivity between about 3000 Ohm-cm and about 10,000 Ohm-cm.

31. The method of claim 24 wherein the charge trapping multilayer has a resistivity between about 3000 Ohm-cm and about 5,000 Ohm-cm.

32. The method of claim 24 wherein a total thickness of the charge trapping multilayer is between about 0.3 micrometers and about 5 micrometers.

33. The method of claim 24 wherein a total thickness of the charge trapping multilayer layer is between about 0.3 micrometers and about 2 micrometers.

34. The method of claim 24 wherein the charge trapping multilayer comprises layers between four and about 100 passivated semiconductor layers.

35. The method of claim 24 wherein the charge trapping multilayer comprises SiGe, as a polycrystalline structure or an amorphous structure.

36. The method of claim 24 wherein the charge trapping multilayer comprises SiC, as a polycrystalline structure or an amorphous structure.

37. The method of claim 24 wherein the charge trapping multilayer comprises Ge, as a polycrystalline structure or an amorphous structure.

38. The method of claim 24 wherein the semiconductor oxide layer in interfacial contact with the charge trapping multilayer has a thickness of at least about 0.1 micrometer.

39. The method of claim 24 wherein the semiconductor oxide layer in interfacial contact with the charge trapping multilayer has a thickness between about 0.1 micrometer and about 10 micrometers.

40. The method of claim 24 wherein the semiconductor oxide layer in interfacial contact with the charge trapping multilayer has a thickness between about 0.1 micrometer and about 2 micrometers.

41. The method of claim 24 wherein the dielectric layer has a thickness between about 10 nanometers and about 10,000 nanometers.

42. The method of claim 24 wherein the single crystal silicon donor substrate is sliced from a single crystal silicon ingot grown by a Czochralski method or a float zone method.

43. The method of claim 24 wherein the single crystal silicon donor substrate has a resistivity between about 1 and about 50 Ohm-cm.

44. The method of claim 24 wherein the single crystal silicon donor substrate has a resistivity between about 5 and about 25 Ohm-cm.

45. The method of claim 24 further comprising:
heating the bonded structure at a temperature and for a duration sufficient to strengthen the bond between the dielectric layer of the single crystal silicon donor structure and the semiconductor oxide layer on the front surface of the single crystal silicon handle substrate;

mechanically cleaving the bonded structure at the cleave plane of the single crystal silicon donor substrate to thereby prepare the silicon-on-insulator device comprising the single crystal silicon handle substrate, the charge trapping multilayer, the semiconductor oxide layer, the dielectric layer in contact with the semiconductor oxide layer, and a single crystal silicon device layer in contact with the dielectric layer; and heating the cleaved structure at a temperature and for a duration sufficient to strengthen the bond.

\* \* \* \* \*